(12) United States Patent
Yem

(10) Patent No.: US 12,225,306 B2
(45) Date of Patent: Feb. 11, 2025

(54) CLOCK GENERATION CIRCUIT AND IMAGE SENSOR

(71) Applicant: PixArt Imaging Inc., Hsin-Chu (TW)

(72) Inventor: Poh Weng Yem, Penang (MY)

(73) Assignee: PixArt Imaging Inc., Hsin-Chu (TW)

( * ) Notice: Subject to any disclaimer, the term of this patent is extended or adjusted under 35 U.S.C. 154(b) by 225 days.

(21) Appl. No.: 17/959,264

(22) Filed: Oct. 3, 2022

(65) Prior Publication Data
US 2024/0114256 A1   Apr. 4, 2024

(51) Int. Cl.
*H04N 25/74* (2023.01)
*H04N 25/71* (2023.01)
*H04N 25/75* (2023.01)
*H04N 25/772* (2023.01)

(52) U.S. Cl.
CPC ........... *H04N 25/745* (2023.01); *H04N 25/75* (2023.01); *H04N 25/772* (2023.01)

(58) Field of Classification Search
CPC ..... H04N 25/745; H04N 25/772; H04N 25/75
See application file for complete search history.

(56) References Cited

U.S. PATENT DOCUMENTS

2016/0211852 A1*  7/2016  Kim .................. H03K 3/011

* cited by examiner

*Primary Examiner* — Lin Ye
*Assistant Examiner* — Fayez A Bhuiyan
(74) *Attorney, Agent, or Firm* — Winston Hsu

(57) ABSTRACT

A clock generation circuit, comprising a first RC circuit, a first switch, a second RC circuit, a second switch, a comparator and a logic circuit. The first RC circuit comprises a first capacitor, coupled to a first predetermined voltage level and a second predetermined voltage level. The second RC circuit comprises a second capacitor, coupled to the first switch. The comparator comprises: a first input terminal, coupled to the second RC circuit and the second switch; a second input terminal, configured to receive a reference voltage level; and an output terminal, coupled to a control terminal of the first switch and a control terminal of the second switch. The logic circuit is coupled to the output terminal of the comparator, configured to generate a clock signal. In one embodiment, the clock generation circuit is applied to an image sensor.

18 Claims, 6 Drawing Sheets

CLOCK GENERATION CIRCUIT AND IMAGE SENSOR

BACKGROUND OF THE INVENTION

1. Field of the Invention

The present invention relates to a clock generation circuit and an image sensor, and particularly relates to a clock generation circuit and an image sensor which can filter noises and reduces the discharging time.

2. Description of the Prior Art

Conventionally, a clock generation circuit always receives an operation voltage to operate accordingly. However, the routing between the input of the operation voltage and the component inside the IC is long and complicated such that the component inside the IC may be affected by noises. Further, the clock generation circuit may perform a discharging operation. However, if the discharging current is too larger, not only the power consumption is high but the circuit may burn due to the large discharging current.

SUMMARY OF THE INVENTION

One objective of the present invention is to provide a clock generation circuit which can filter noises and can reduce a discharging time.

Another objective of the present invention is to provide an image sensor which can filter noises and can reduce a discharging time.

One embodiment of the present invention discloses a clock generation circuit, comprising a first RC circuit, a first switch, a second RC circuit, a second switch, a comparator and a logic circuit. The first RC circuit comprises a first capacitor, coupled to a first predetermined voltage level and a second predetermined voltage level. The first switch is coupled to the first RC circuit. The second RC circuit comprises a second capacitor, coupled to the first switch. The second switch is coupled to the second RC circuit. The comparator comprises: a first input terminal, coupled to the second RC circuit and the second switch; a second input terminal, configured to receive a reference voltage level; and an output terminal, coupled to a control terminal of the first switch and a control terminal of the second switch. The logic circuit is coupled to the output terminal of the comparator, configured to generate a clock signal.

In one embodiment, the above-mentioned clock generation circuit is applied to an image sensor and the clock signal is received by at least one of the pixel array, the reading circuit and the ADC, which are in the image sensor.

In view of above-mentioned embodiments, the noises can be filtered by the second RC circuit. Also, the discharging current or the discharging time can be reduced, thus the power consumption can be decreased and the circuit burning can be avoided.

These and other objectives of the present invention will no doubt become obvious to those of ordinary skill in the art after reading the following detailed description of the preferred embodiment that is illustrated in the various figures and drawings.

DETAILED DESCRIPTION

Several embodiments are provided in following descriptions to explain the concept of the present invention. The term "first", "second", "third" in following descriptions are only for the purpose of distinguishing different one elements, and do not mean the sequence of the elements. For example, a first device and a second device only mean these devices can have the same structure but are different devices.

Figure 1:
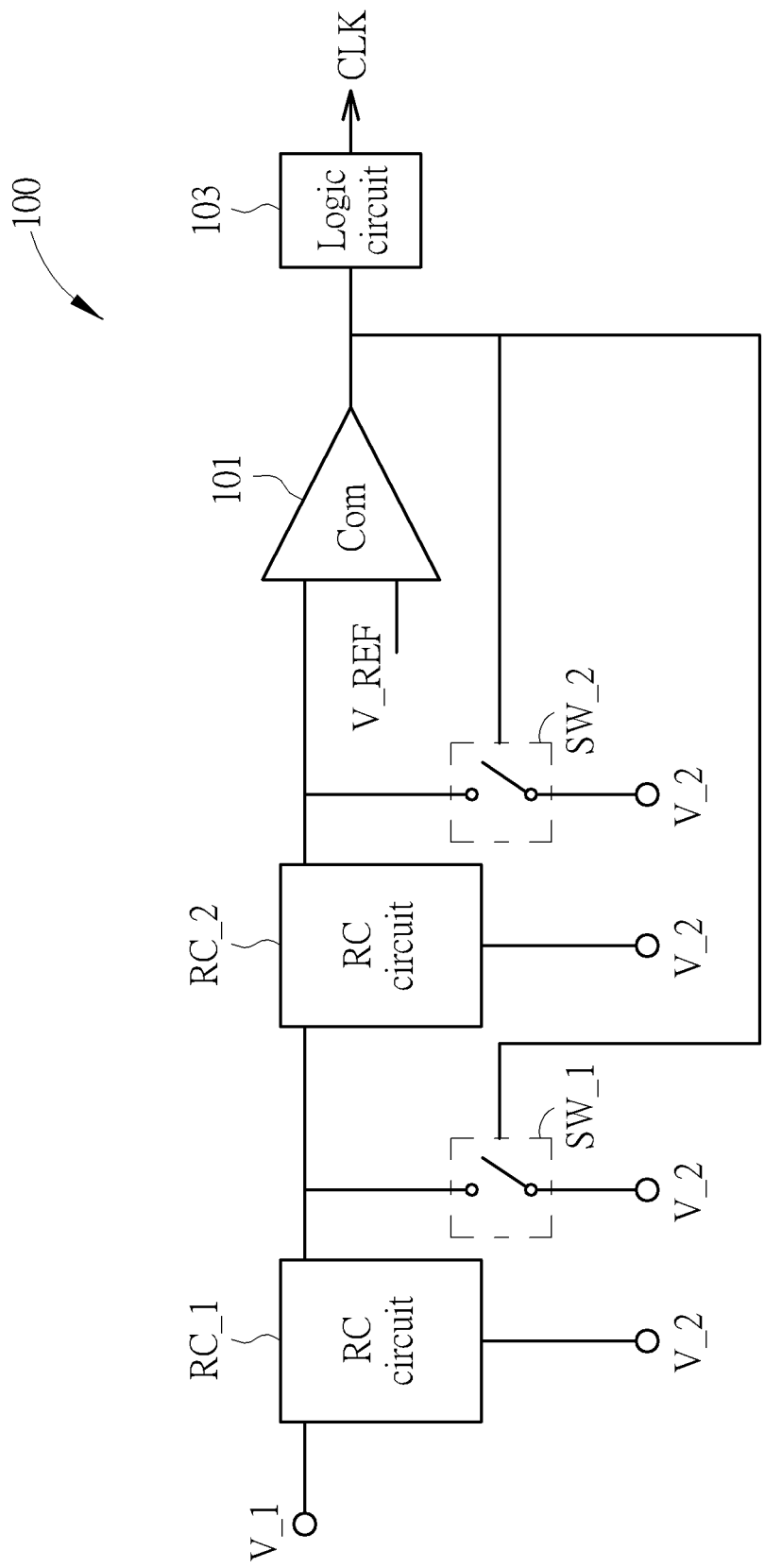
FIG. 1 is a block diagram illustrating a clock generation circuit according to one embodiment of the present invention.

FIG. 1 is a block diagram illustrating a clock generation circuit according to one embodiment of the present invention. As illustrated in FIG. 1, the clock generation circuit 100 comprises a first RC circuit RC_1, a first switch SW_1, a second RC circuit RC_2, a second switch SW_1, a comparator 101 and a logic circuit 103. The first RC circuit RC_1 comprises a first capacitor and is coupled to a first predetermined voltage level V_1 and a second predetermined voltage level V_2. In one embodiment the first predetermined voltage level V_1 is an operation voltage V_DD and the second predetermined voltage level V_2 is a ground voltage level. The first switch SW_1 is coupled to the first RC circuit RC_1 and the second predetermined voltage V_2. The second RC circuit RC_2 comprises a second capacitor, and is coupled to the first switch SW_1 and the second predetermined voltage level V_2. The second switch SW_2 is coupled to the second RC circuit RC_2 and the second predetermined voltage level V_2. Details about the first capacitor in the first RC circuit RC_1 and the second capacitor in the second RC circuit RC_2 will be described in following descriptions.

Also, the comparator 101 comprises: a first input terminal, coupled to the second RC circuit RC_2 and the second switch SW_2; a second input terminal configured to receive a reference voltage level V_REF; and an output terminal coupled to a control terminal of the first switch SW_1 and a control terminal of the second switch SW_2. The logic circuit 103 is coupled to the output terminal of the comparator 101, and is configured to generate an output clock signal CLK. In one embodiment, the first RC circuit RC_1 is provided outside an IC. In such case, the first switch SW_1, the second RC circuit RC_2, the second switch SW_2, the comparator 101 and the logic circuit 103 are provided inside the IC. The second RC circuit RC_2 can filter the noises, such that other components inside the IC can be avoided from affected by the noises. Therefore, in one embodiment, the second RC circuit RC_2 is provided at a location which is close to the comparator 101. The distance between the first RC circuit RC_1, the comparator 101 and the distance between the second RC circuit RC_2, the comparator 101 can be set corresponding to different design requirements.

Figure 2:
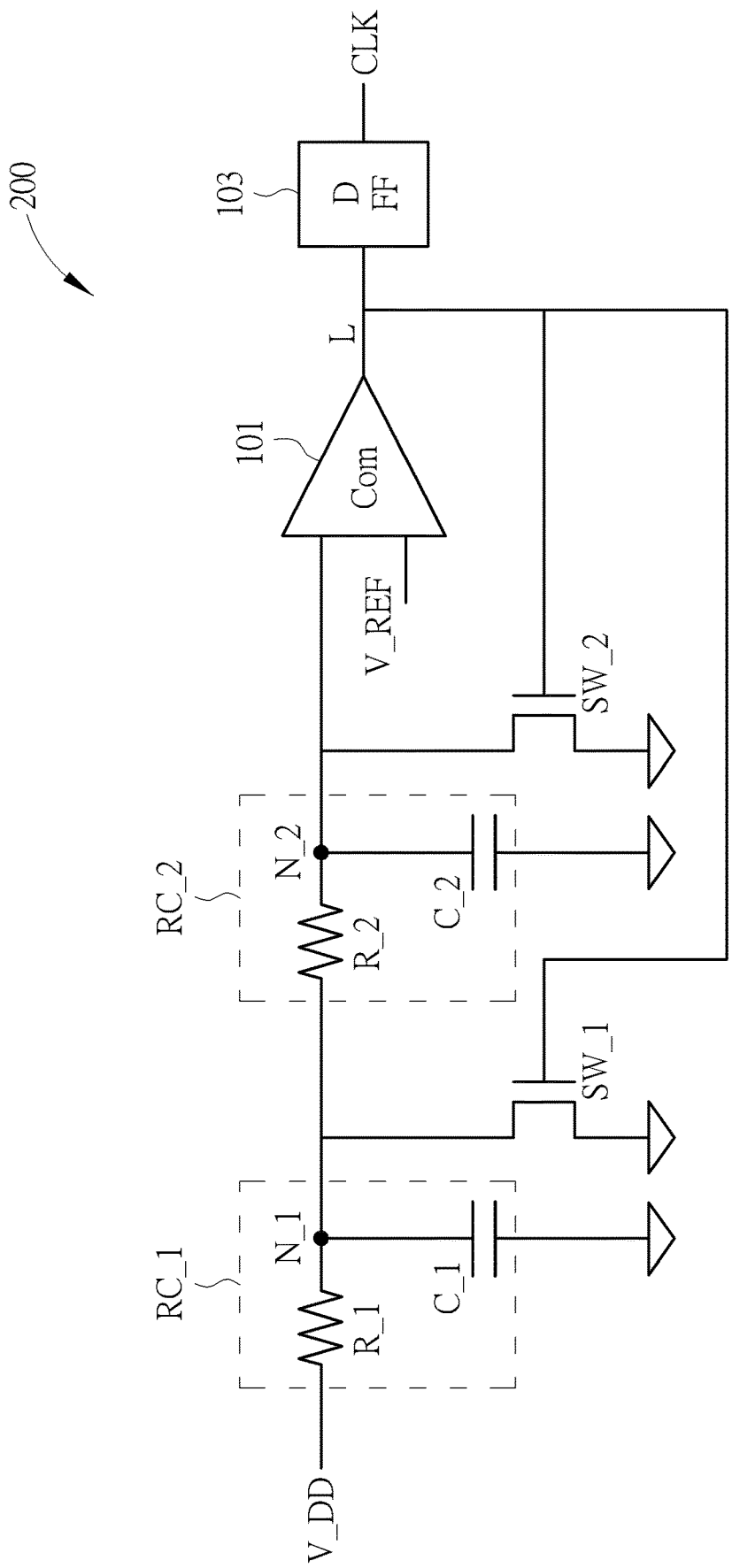
FIG. 2 is a circuit diagram illustrating a clock generation circuit according to one embodiment of the present invention.

FIG. 2 is a circuit diagram illustrating a clock generation circuit 200 according to one embodiment of the present invention. Please note, FIG. 2 is only for example and a clock generation circuit with circuitries which can perform the same function should also fall in the scope of the present invention. Further, the above-mentioned first predetermined voltage level V_1 is the operation voltage V_DD and the above-mentioned second voltage level V_2 is a ground voltage level in this embodiment. As illustrated in FIG. 2, the first RC circuit RC_1 comprises a first resistor R_1 and a first capacitor C_1, and the second RC circuit RC_2 comprises a second resistor R_2 and a second capacitor C_2. Also, the first switch SW_1 and the second switch SW_2 are NMOSFETs, and the logic circuit 103 is a D Flip-Flop. Please note, the first switch SW_1 and the second switch SW_2 can be replaced by other transistors such as PMOSFETs. The first switch SW_1 and the second switch SW_2 can also be replaced by other components besides the transistors, for example, BJTs.

For more detail, the first resistor R_1 is coupled between the operation voltage V_DD and the first capacitor C_1. One terminal of the first capacitor C_1 is coupled to the ground voltage level. The source terminal of the first switch SW_1 is coupled to the ground voltage level. The gate terminal of the first switch SW_1 receives a comparing signal L output by the comparator 101. Besides, the second resistor R_2 is coupled to the first switch SW_1, the second capacitor C_2, the second switch SW_2 and the first input terminal of the comparator 101. One terminal of the second capacitor C_2 is coupled to the ground voltage level. The source terminal of the second switch SW_2 is coupled to the ground voltage level. The gate terminal of the second switch SW_2 receives the comparing signal L.

Figure 3:
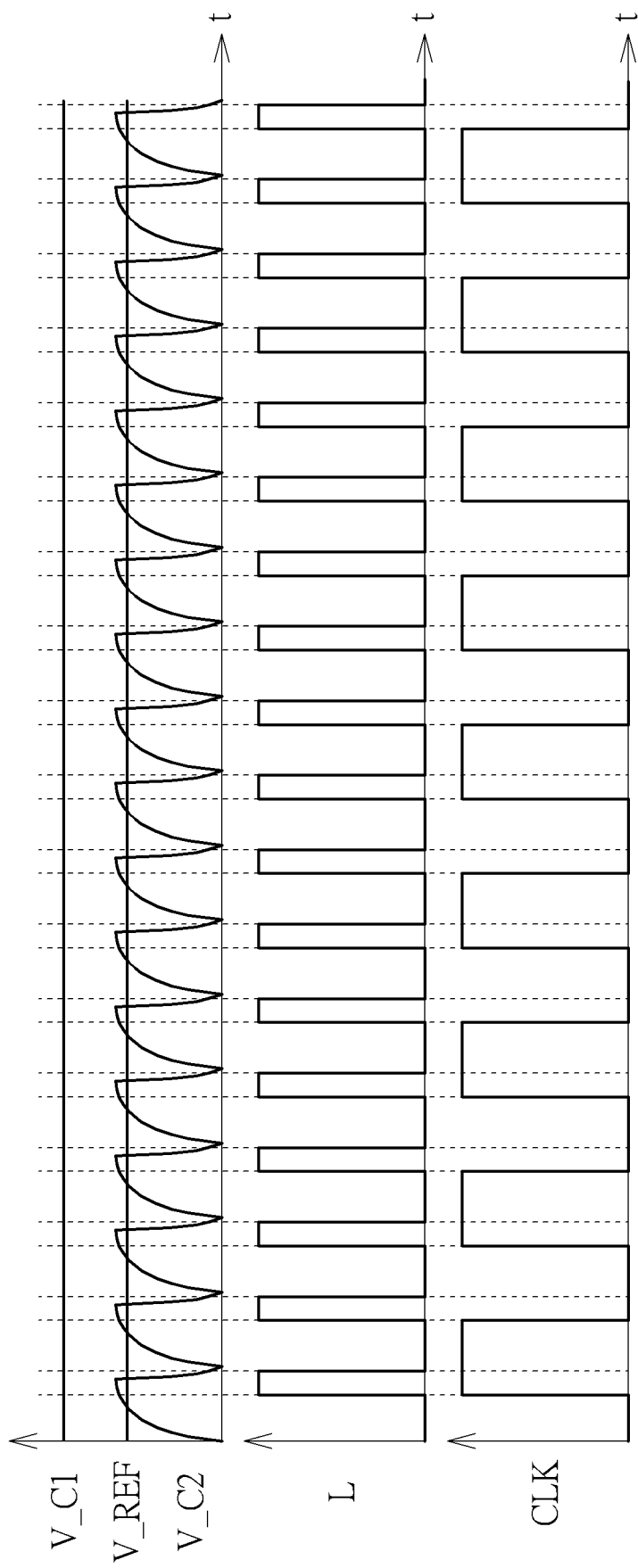
FIG. 3 is a wave chart illustrating operations of the clock generation circuit in FIG. 2 of the present invention, according to one embodiment of the present invention.

The resistance of the first resistor R_1 can be set corresponding different design requirements. FIG. 3 is a wave chart illustrating operations of the clock generation circuit 200 in FIG. 2 of the present invention, according to one embodiment of the present invention. In the embodiment of FIG. 3, the resistance of the first resistor R_1 is set to be very small such that can be regarded as a portion of a transmission line between the first predetermined voltage level V_1 and the first capacitor C_1. In other words, in the embodiment of FIG. 3, the first resistor R_1 can be regarded not existing.

In FIG. 3, the first capacitor voltage V_C1 is the voltage of the first capacitor C_1. That is, the first capacitor voltage V_C1 is the voltage at a node N_1 at which the first RC circuit RC_1, the first switch SW_1 and the second RC circuit RC_2 are coupled. The reference voltage V_REF is the voltage received by the second input terminal of the comparator 101. The second capacitor voltage V_C2 is the voltage of the second capacitor C_2. Namely, the second capacitor voltage V_C2 is the voltage at a node N 2 at which the second RC circuit RC_2, the second switch SW_2 and the first input terminal of the comparator 101 are coupled. Besides, the comparing signal L is the signal output by the comparator 101, which may have a high logic value or a low logic value. In following embodiments, the high logic value is 1 and the low logic value is 0. Additionally, the output clock signal CLK is the signal output by the logic circuit 103.

In the embodiment of FIG. 3, for the initial state (t=0 s), the second capacitor C_2 has no charge thus the second capacitor voltage V_C2 is 0. Also, the comparing signal L is 0 and the output clock signal CLK has a low voltage level. The clock generation circuit 200 operates in a charging mode if the comparing signal L is 0. During the charging mode, the first switch SW_1, the second switch SW_2 turn off (non-conducted), thus the second capacitor C_2 is charged until the second capacitor voltage V_C2 is higher than the reference voltage V_REF. The comparing signal L transits from 0 to 1 when the second capacitor voltage V_C2 is higher than the reference voltage V_REF.

The clock generation circuit 200 operates in a discharging mode if the comparing signal L is 1. In such case, the first switch SW_1 and the second switch SW_2 turn on (conducted), thus the second capacitor C_2 is discharged. The discharging mode ends when the second capacitor voltage V_C2 goes below the reference voltage V_REF. The comparing signal L transits from 1 to 0 when the second capacitor voltage V_C2 goes below the reference voltage V_REF, thereby the first switch SW_1 and the second SW_2 turn off.

In one embodiment, a capacitance of the first capacitor C_1 is much larger than a capacitance of the second capacitor C_2. In such case, since the capacitance of the second capacitor C_2 is very small compared with the capacitance of the first capacitor C_1, the charge stored in the second capacitor C_2 can be discharged much faster than the charge stored in the first capacitor C_1. As such, the second capacitor V_C2 quickly go down below the reference voltage level V_REF and further forcing the comparing signal L to be 0. By this way, the first switch SW_1 turns off in a much faster speed. Thereby, the high discharging current for the first capacitor C_1 only occurs in a very short period.

The charging mode and the discharging mode continue in a periodically manner as shown in FIG. 3. In one embodiment, the D flip flop which serves as the logic circuit 103 divides a frequency of the comparing signal L by half. By this way, the output clock signal CLK with a 50% duty cycle can be generated. However, it will be appreciated that the clock generation circuit provided by the present invention is not limited to generate an output clock signal CLK with a 50% duty cycle.

As illustrated in FIG. 3, the first switch SW_1 only turns on for a very short time. Thus, the loading to the transmission line for the operation voltage V_DD is greatly reduced. As such, the first capacitor voltage V_C1 is a stable voltage level and the circuit operation of the clock generation circuit 200 only relies on the second RC circuit RC_2.

Figure 4:
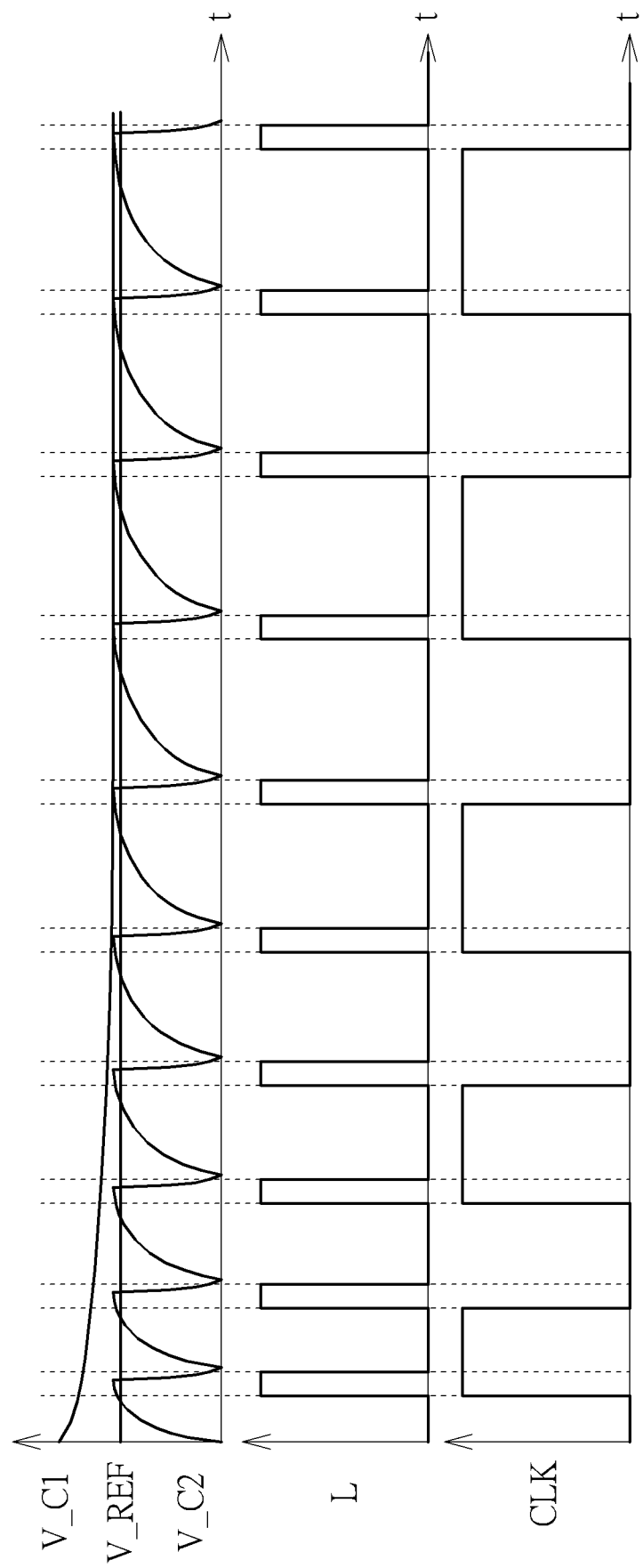
FIG. 4 is a wave chart illustrating operations of the clock generation circuit in FIG. 2 of the present invention, according to another embodiment of the present invention.

In the embodiment of FIG. 4, the resistance of the first resistor R_1 is large enough thus could not be regarded as not existing. In FIG. 4, for the initial state, the first capacitor C_1 is fully charged thus is equal to the operation voltage V_DD. On the opposite, the second capacitor C_2 has no charge thus the second capacitor voltage V_C2 is 0. Therefore, the comparing signal L is 0.

During the charging mode (i.e., the second capacitor C_2 is lower than the reference voltage level V_REF), the first switch SW_1, the second switch SW_2 turn off thus the second capacitor C_2 is charged. As above-mentioned, the first capacitor C_1 is fully charged thus is not charged in the charging mode. However, in another embodiment, the first capacitor C_1 is charged in the charging mode since the first capacitor C_1 is not fully charged.

As above-mentioned, in one embodiment, the capacitance of the first capacitor C_1 is much larger than the capacitance of the second capacitor C_2. Therefore, a charging speed of the second capacitor C_2 is much faster than which of the first capacitor C_1. Thereby, the first capacitor C_1 is quickly discharged to the second capacitor C_2 and is slowly charged from the operation voltage V_DD. Accordingly, the second capacitor voltage V_2 rises and the first capacitor voltage V_1 falls. The comparing signal L transits from 0 to 1 when the second capacitor voltage V_C2 is higher than the reference voltage V_REF.

Next, in the discharging mode, both the first switch SW_1 and the second switch SW_2 turn on since the comparing signal L is 1. Again, a discharging speed of the second capacitor C_2 is much faster than which of the first capacitor C_1 since the capacitance of the first capacitor C_1 is much larger than the capacitance of the second capacitor C_2. As such, the second capacitor voltage V_C2 drops faster than the first capacitor voltage V_C1 drops. The discharging mode ends when the second capacitor voltage V_C2 goes below the reference voltage V_REF. The comparing signal L transits from 1 to 0 when the second capacitor voltage V_C2 goes below the reference voltage V_REF, thereby the first switch SW_1 and the second SW_2 turn off.

The charging mode and the discharging mode continue until the first capacitor voltage V_C1 is slightly above the reference voltage V_REF. When this condition is achieved, the charging mode and the discharging mode keep repeatedly in a periodically manner as shown in FIG. 4. In one embodiment, the D flip flop which serves as the logic circuit 103 divides a frequency of the comparing signal L by half. By this way, the output clock signal CLK with a 50% duty cycle can be generated. However, it will be appreciated that the clock generation circuit provided by the present invention is not limited to generate an output clock signal CLK with a 50% duty cycle.

The charging time (i.e., time of the charging mode) and the discharging time (i.e., time of the discharging mode) can be set via setting the resistance values of the first resistor R_1, the second resistor R_2 and/or the capacitances of the first capacitor C_1, the second capacitor C_2. In one embodiment, the clock generation circuit provided by the present invention further comprises a discharging time setting circuit, which is configured to set a discharging time during which the second capacitor C_2 is discharged.

Figure 5:
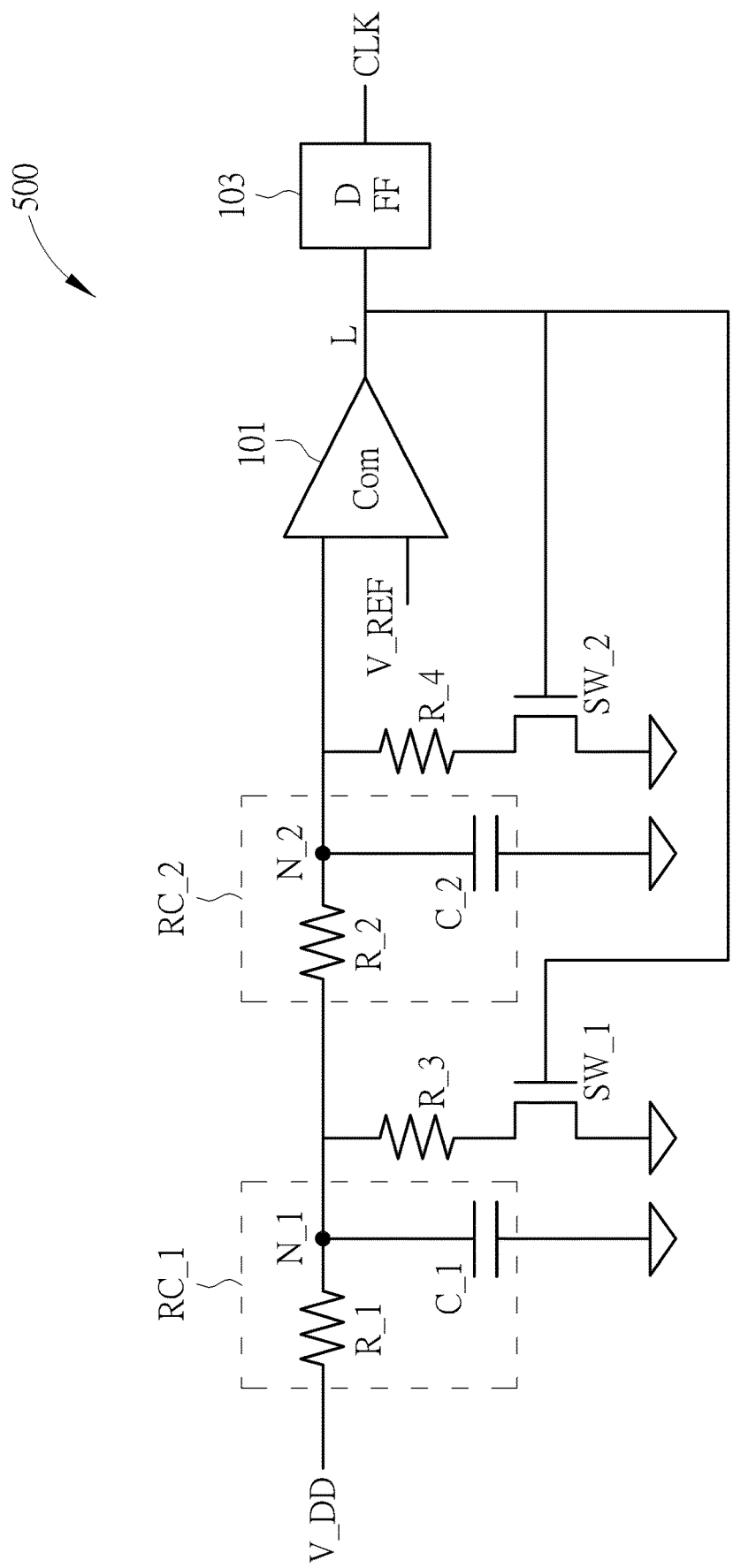
FIG. 5 is a circuit diagram illustrating a clock generation circuit, according to another embodiment of the present invention.

FIG. 5 is a circuit diagram illustrating a clock generation circuit 500, according to another embodiment of the present invention. The clock generation circuit 500 comprises the above-mentioned discharging time setting circuit, which is formed by the third resistor R_3 and the fourth resistor R_4. Specifically, the third resistor R_3 is coupled between the first capacitor C_1 and the first switch SW_1. Besides, the fourth resistor R_4 is coupled between the second capacitor C_2 and the second switch SW_2. In such case, the discharging time can be set via setting resistances of the third resistor R_3 and the fourth resistor R_4.

Additionally, in one embodiment, the discharging time can be set via setting resistances of the first switch SW_1 and the second switch SW_2 if the first switch SW_1 and the second switch SW_2 are transistors or any other device with resistances which can be adjusted. For example, the first switch SW_1 and the second switch SW_2 have resistances which can be adjusted via different biasing voltages, different ion doping concentrations, different sizes or different codes. In such case, the discharging time setting circuit can be regarded comprising the first switch and the second switch.

Figure 6:
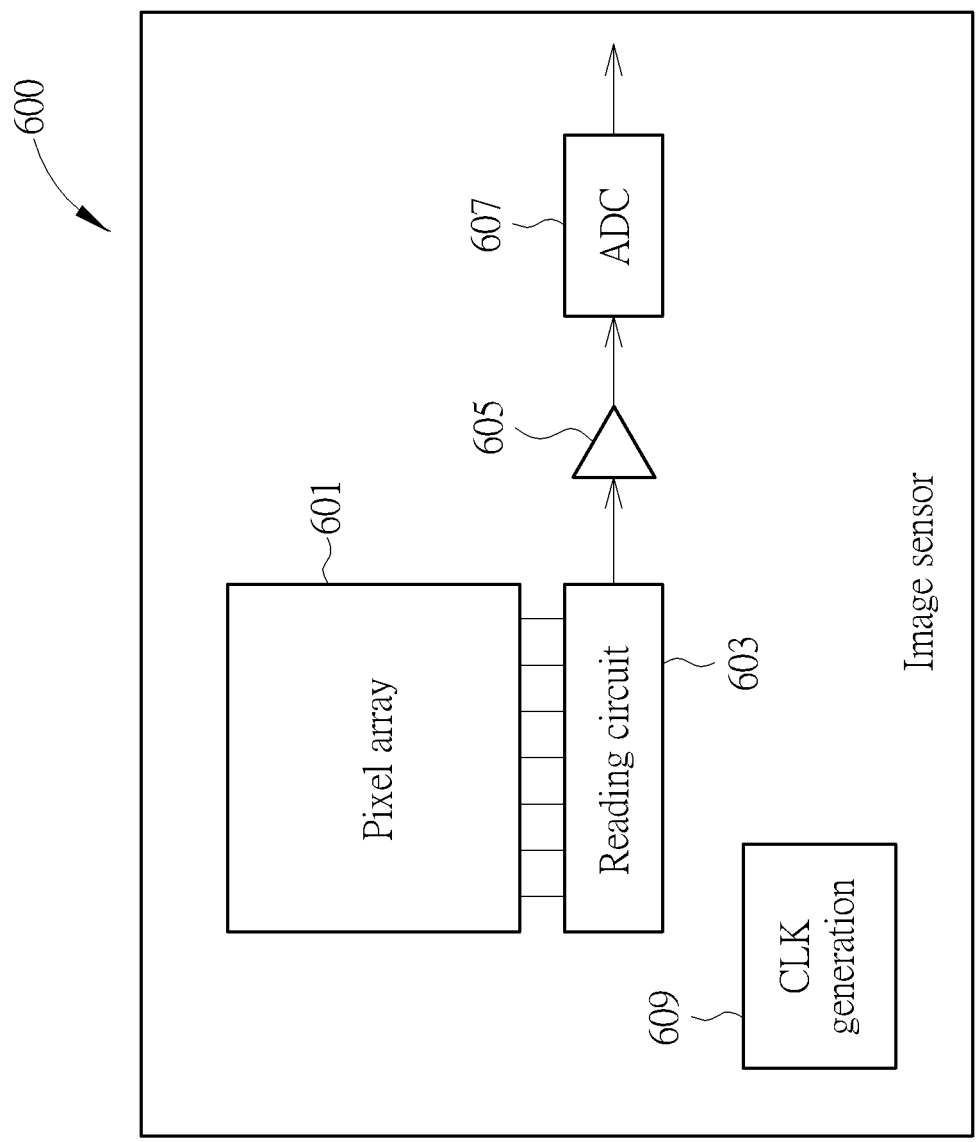
FIG. 6 is a block diagram illustrating an image sensor applying the clock generation circuit provided by the present invention, according to one embodiment of the present invention.

The clock generation circuit provided by the present invention can be applied to any circuit or device. In one embodiment, the clock generation circuit is applied to an image sensor. FIG. 6 is a block diagram illustrating an image sensor 600 applying the clock generation circuit provided by the present invention, according to one embodiment of the present invention. As illustrated in FIG. 6, the image sensor 600 comprises a pixel array 601, a reading circuit 603, the amplifier 605, an ADC 607 and a clock generation circuit 609.

The pixel array 601 is configured to sense an image to generate image sensing signals. The reading circuit 603 is configured to read the image sensing signals. The amplifier 605 is configured to amplify the image sensing signals, but can be removed from the image sensor 600. Also, the ADC 607 is configured to generate digital signals according the image sensing signals (or amplified image sensing signals) for following processes. The clock generation circuit 609 can have the structures or operations illustrated in FIG. 1, FIG. 2, FIG. 3, FIG. 4 and FIG. 5. Further, the clock signals generated by the clock generation circuit 609 can be used by at least one of the pixel array 601, the reading circuit 603, the amplifier 605, and the ADC 607. For example, the clock signals generated by the clock generation circuit 609 are used by the reading circuit 603 and the ADC 607. However, the image sensor which comprises the clock signal generation circuit is not limited to the components illustrated in FIG. 6.

In view of above-mentioned embodiments, the noises can be filtered by the second RC circuit. Also, the discharging current or the discharging time can be reduced, thus the power consumption can be decreased and the circuit burning can be avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A clock generation circuit, comprising:
   a first RC circuit, comprising a first capacitor, coupled to a first predetermined voltage level and a second predetermined voltage level;
   a first switch, coupled to the first RC circuit;
   a second RC circuit, comprising a second capacitor, coupled to the first switch;
   a second switch, coupled to the second RC circuit;
   a comparator, comprising:
      a first input terminal, coupled to the second RC circuit and the second switch;
      a second input terminal, configured to receive a reference voltage level; and
      an output terminal, coupled to a control terminal of the first switch and a control terminal of the second switch; and
   a logic circuit, coupled to the output terminal of the comparator, configured to generate a clock signal;
   wherein the first switch and the second switch turn on and the second capacitor is discharged when a voltage of the second capacitor is higher than the reference voltage level;
   wherein the clock generation circuit further comprises:
   a discharging time setting circuit, configured to set a discharging time during which the second capacitor is discharged.

2. The clock generation circuit of claim 1,
   wherein the first RC circuit further comprises:
   a first resistor, coupled between the first predetermined voltage level and the first capacitor.

3. The clock generation circuit of claim 1,
   wherein the second RC circuit further comprises:

a second resistor, coupled to the first switch, the second capacitor, the second switch and the first input terminal.

4. The clock generation circuit of claim 1, wherein the logic circuit is a D flip flop.

5. The clock generation circuit of claim 1,
wherein the first RC circuit is provided outside an IC;
wherein the first switch, the second RC circuit, the second switch, the comparator and the logic circuit are provided inside the IC.

6. The clock generation circuit of claim 1,
wherein the first switch and the second switch turn off and the second capacitor is charged when a voltage of the second capacitor is lower than the reference voltage level.

7. The clock generation circuit of claim 1, wherein the discharging time setting circuit comprises:
a third resistor, coupled between the first capacitor and the first switch; and
a fourth resistor, coupled between the second capacitor and the second switch.

8. The clock generation circuit of claim 1,
wherein the discharging time setting circuit comprises the first switch and the second switch, if the first switch and the second switch has adjustable resistances.

9. An image sensor, comprises:
a pixel array, configured to sense an image to generate image sensing signals;
a reading circuit, configured to read the image sensing signals;
an ADC, configured to generate digital signals according to the image sensing signals; and
a clock generation circuit, comprising:
a first RC circuit, comprising a first capacitor, coupled to a first predetermined voltage level and a second predetermined voltage level;
a first switch, coupled to the first RC circuit;
a second RC circuit, comprising a second capacitor, coupled to the first switch;
a second switch, coupled to the second RC circuit;
a comparator, comprising:
a first input terminal, coupled to the second RC circuit and the second switch;
a second input terminal, configured to receive a reference voltage level; and
an output terminal, coupled to a control terminal of the first switch and a control terminal of the second switch; and
a logic circuit, coupled to the output terminal of the comparator, configured to generate a clock signal to at least one of the pixel array, the reading circuit and the ADC;
wherein the first switch and the second switch turn on and the second capacitor is discharged when a voltage of the second capacitor is higher than the reference voltage level;
wherein the image sensor further comprises:
a discharging time setting circuit, configured to set a discharging time during which the second capacitor is discharged.

10. The image sensor of claim 9,
wherein the first RC circuit further comprises:
a first resistor, coupled between the first predetermined voltage level and the first capacitor.

11. The image sensor of claim 9,
wherein the second RC circuit further comprises:
a second resistor, coupled to the first switch, the second capacitor, the second switch and the first input terminal.

12. The image sensor of claim 9, wherein the logic circuit is a D flip flop.

13. The image sensor of claim 9,
wherein the first RC circuit is provided outside an IC;
wherein the first switch, the second RC circuit, the second switch, the comparator and the logic circuit are provided inside the IC.

14. The image sensor of claim 9,
wherein the first switch and the second switch turn off and the second capacitor is charged when a voltage of the second capacitor is lower than the reference voltage level.

15. The image sensor of claim 9, wherein the discharging time setting circuit comprises:
a third resistor, coupled between the first capacitor and the first switch; and
a fourth resistor, coupled between the second capacitor and the second switch.

16. The image sensor of claim 9,
wherein the discharging time setting circuit comprises the first switch and the second switch, if the first switch and the second switch has adjustable resistances.

17. A clock generation circuit, comprising:
a first RC circuit, comprising a first capacitor, coupled to a first predetermined voltage level and a second predetermined voltage level;
a first switch, coupled to the first RC circuit;
a second RC circuit, comprising a second capacitor, coupled to the first switch;
a second switch, coupled to the second RC circuit;
a comparator, comprising:
a first input terminal, coupled to the second RC circuit and the second switch;
a second input terminal, configured to receive a reference voltage level; and
an output terminal, coupled to a control terminal of the first switch and a control terminal of the second switch; and
a logic circuit, coupled to the output terminal of the comparator, configured to generate a clock signal;
wherein the first RC circuit is provided outside an IC;
wherein the first switch, the second RC circuit, the second switch, the comparator and the logic circuit are provided inside the IC.

18. An image sensor, comprises:
a pixel array, configured to sense an image to generate image sensing signals;
a reading circuit, configured to read the image sensing signals;
an ADC, configured to generate digital signals according to the image sensing signals; and
a clock generation circuit, comprising:
a first RC circuit, comprising a first capacitor, coupled to a first predetermined voltage level and a second predetermined voltage level;
a first switch, coupled to the first RC circuit;
a second RC circuit, comprising a second capacitor, coupled to the first switch;
a second switch, coupled to the second RC circuit;
a comparator, comprising:
a first input terminal, coupled to the second RC circuit and the second switch;
a second input terminal, configured to receive a reference voltage level; and
an output terminal, coupled to a control terminal of the first switch and a control terminal of the second switch; and a logic circuit, coupled to the output terminal of the comparator, configured to generate a clock signal to at least one of the pixel array, the reading circuit and the ADC;

wherein the first RC circuit is provided outside an IC;

wherein the first switch, the second RC circuit, the second switch, the comparator and the logic circuit are provided inside the IC.

* * * * *